United States Patent
Xie et al.

(10) Patent No.: US 9,910,167 B2
(45) Date of Patent: Mar. 6, 2018

(54) METHOD FOR DIGITALIZING SCINTILLATION PULSE

(71) Applicant: RAYCAN TECHNOLOGY CO., LTD. (SU ZHOU), Suzhou, Jiangsu (CN)

(72) Inventors: Qingguo Xie, Suzhou (CN); Qiude Zhang, Suzhou (CN); Anwen Long, Suzhou (CN); Zhangjing Xiong, Suzhou (CN)

(73) Assignee: RAYCAN TECHNOLOGY CO., LTD. (SU ZHOU), Suzhou New District, Suzhou, Jiangsu (CN)

( * ) Notice: Subject to any disclaimer, the term of this patent is extended or adjusted under 35 U.S.C. 154(b) by 0 days.

(21) Appl. No.: 15/541,220

(22) PCT Filed: Oct. 27, 2015

(86) PCT No.: PCT/CN2015/092909
§ 371 (c)(1),
(2) Date: Jun. 30, 2017

(87) PCT Pub. No.: WO2016/110141
PCT Pub. Date: Jul. 14, 2016

(65) Prior Publication Data
US 2017/0357012 A1    Dec. 14, 2017

(30) Foreign Application Priority Data
Jan. 5, 2015  (CN) .......................... 2015 1 0003057

(51) Int. Cl.
*H03M 1/50* (2006.01)
*G01T 1/208* (2006.01)
(Continued)

(52) U.S. Cl.
CPC ................ *G01T 1/208* (2013.01); *G01T 1/17* (2013.01); *G04F 10/005* (2013.01); *H03M 1/1245* (2013.01)

(58) Field of Classification Search
CPC ......... G01T 1/208; G01T 1/17; G04F 10/005; H03M 1/1245
(Continued)

(56) References Cited

U.S. PATENT DOCUMENTS 6,664,543 B2* 12/2003 Moyers ................ G01T 1/2985
250/363.03
8,309,933 B1* 11/2012 Wang ........................ G01T 1/17
250/252.1
(Continued)

FOREIGN PATENT DOCUMENTS

CN    101561507 A    10/2009
CN    102486402 A     6/2012
(Continued)

OTHER PUBLICATIONS

International Search Report corresponding to Application No. PCT/CN2015/092909; dated Jan. 27, 2016.
(Continued)

*Primary Examiner* — Khai M Nguyen
(74) *Attorney, Agent, or Firm* — Cantor Colburn LLP (57) ABSTRACT

A method for digitalizing a scintillation pulse may include: S1, acquiring a pulse database outputted by a detector irradiated by rays of different energy; S2, sampling and 5 quantizing each of pulses in the pulse database obtained in S1 to acquire complete energy information comprised in the pulse, S3, undersampling and quantizing each of the pulses in the pulse database obtained in step S1, and estimating or fitting energy information by using pulse prior information; S4, with the energy information obtained in S2 as a standard,
(Continued)

determining a mapping relationship between 10 the energy information obtained by a prior information-based undersampling pulse energy acquisition method and the energy information obtained by the method of S2; and S5 correcting the energy information obtained by the prior information-based undersampling pulse energy acquisition method by using the energy mapping relationship obtained in S4.

25 Claims, 4 Drawing Sheets (51) Int. Cl.
   *H03M 1/12*   (2006.01)
   *G01T 1/17*   (2006.01)
   *G04F 10/00*  (2006.01)
(58) Field of Classification Search
   USPC .......................................... 341/166
   See application file for complete search history.

(56) References Cited

U.S. PATENT DOCUMENTS

| 9,136,858 | B2* | 9/2015 | Xie ............................ G01T 1/17 |
| 2014/0318268 | A1 | 10/2014 | Sorensen et al. |
| 2015/0200680 | A1 | 7/2015 | Xie et al. |

FOREIGN PATENT DOCUMENTS

| CN | 102843139 A | 12/2012 |
| CN | 103969675 A | 8/2014 |
| WO | 2012142778 A1 | 10/2012 |

OTHER PUBLICATIONS

N. Zhang et al., "A Pulse Shape Restore Method for Event Localization in PET Scintillation Detection," IEEE; 2004, pp. 4084-4088.

Q. Xie et al., "A New Approach for Pulse Processing in Positron Emission Tomography," IEEE Transactions on Nuclear Science; Aug. 2005, pp. 988-995, vol. 52, No. 4.

Z. Deng et al., "Empirical Bayesian Energy Estimation for Multi-Voltage Threshold Digitizer in PET," IEEE; 2013.

* cited by examiner

METHOD FOR DIGITALIZING SCINTILLATION PULSE

CROSS REFERENCE TO RELATED APPLICATION

This is the U.S. national stage of application No. PCT/CN2015/092909, filed Oct. 27, 2015. Priority under 35 U.S.C. § 119(a) and 35 U.S.C. § 365(b) is claimed from Chinese Application No. 201510003057.1, filed Jan. 5, 2015, the disclosure of which is also incorporated herein by reference.

FIELD OF THE INVENTION

The present disclosure relates to the field of ionizing radiation detection and nuclear medicine imaging, and in particular to a method for digitalizing a scintillation pulse.

BACKGROUND OF THE INVENTION

Energy information of an outputted pulse of an ionizing radiation detector is a kind of basic information to be obtained in the field of ionizing radiation detection, which has a plenty of uses, including distinguishing the type of a ray in ionizing radiation detection, judging whether a ray is scattered by a substance in the field of nuclear medicine imaging, and determining a deposition position of a ray in a detector of a location-sensitive type photoelectric device. In an ionizing radiation detector, for the same detector, usually amplitude of an electric pulse signal output by a detector is linear to energy deposited in the detector by a ray, and a rise time and a fall time of a pulse are both constants. So normally an area surrounded by a pulse signal waveform and the time axis (that is to count the quantity of the total charges generated by a ray in a detector) is used to represent energy of an ionizing radiation source.

There are two traditional pulse energy acquisition methods for an ionizing radiation detector. A first method is to utilize a charge integral circuit to collect charge carried by a pulse outputted by a detector, and then use a slow speed Analog-to-Digital Converter (hereafter referred to as ADC) to sample the maximum charge quantity stored in a capacitor in the integral circuit to represent the energy value deposited in the detector by a ray. A second method is to perform integral shaping on a pulse outputted by a detector to form a relative slow speed signal, then perform slow speed ADC sampling, and finally perform numerical integration on sampling points to obtain the energy of a pulse. The integration process in the traditional energy acquisition methods limits the maximum counting rate of a system. In addition, an analog integral shaping circuit is easily influenced by external factors like temperature and so on, thereby leading to the performance changing with environments. Furthermore, a parameter of an analog circuit needs to be adjusted according to a specific application, so that the correction and maintenance of a system becomes considerable difficult. By using a high speed ADC to directly digitalize an electric pulse signal outputted by a detector, the defects of the traditional methods can be solved, but problems of high cost and high power consumption are brought. Moreover, the high speed ADC has higher requirements for a back end processing speed and a transmission bandwidth, which increases the difficulty of designing a back end processing circuit.

In order to solve bottleneck problems of the high counting energy acquisition, some scholar put forward a prior information-based undersampling pulse energy acquisition method. The core of the method lies in that by utilizing prior information including a physical model of a pulse, pulse characteristics, etc. of an electric pulse outputted by a detector, a pulse signal can be rebuilt by obtaining only a few of sampling points and solving a maximum-likelihood solution with given sampling points based on principle of statistics or curve fitting, thereby obtaining the pulse energy information. Typical prior information-based undersampling pulse energy acquisition methods include (1) a multi-voltage threshold (MVT) method, (2) an ADC sampling points fitting method, (3) an empirical Bayesian energy estimation method, and a TOT method.

The multi-voltage threshold method includes: presetting multiple voltage thresholds; inputting a pulse signal and the voltage thresholds respectively into two ports of a comparator; measuring the time when a turnover logic pulse is outputted by the comparator, where the time value and a corresponding voltage threshold compose an MVT sampling point; after rebuilding the pulse through curve fitting using the MVT sampling points and pulse signal prior information, obtaining pulse energy information by means of definite integration or by numerical integration after resampling (for detailed information, refer to the reference document: Qingguo Xie, Chien-Min Kao, Zekai Hsiau, and Chin-Tu Chen, "A New Approach for Pulse Processing in Positron Emission Tomography", IEEE TRANSACTIONS ON NUCLEAR SCIENCE, VOL.52, NO.4, AUGUST 2005).

The ADC sampling points fitting method includes: using a relative slow speed ADC to sample a pulse signal to obtain multiple ADC sampling points; after rebuilding the pulse through curve fitting using the sampling points and pulse signal prior information, obtaining pulse energy information by means of definite integration or by numerical integration after resampling (for detailed information, refer to the reference document: Nan Zhang, Niraj Doshi, Mehmet Aykac, Ronald Grazioso, Michael Loope, Greg Givens, Lars Eriksson, Florian Bauer, John Young, and Matthias Schmand, "A Pulse Shape Restore Method for Event Localization in PET Scintillation Detection", Nuclear Science Symposium Conference Record, Vol.7, 2004).

The empirical Bayesian energy estimation method includes: solving a maximum-likelihood solution of given numeral samples as estimated pulse energy information by utilizing Bayesian theory and independence assumption after acquiring pulse digital sampling points (for detailed information, refer to the reference document: Zhenzhou Deng, Qingguo Xie, "Empirical Bayesian energy estimation for Multi-Voltage Threshold digitizer in PET", Nuclear Science Symposium and Medical Imaging Conference, 2013 IEEE).

The TOT method includes: estimating an energy expected value of a pulse as pulse energy information by fitting the relationship between TOT and pulse energy (for detailed information, refer to the reference document: D. Nygren, "Converting vice to virtue: can time-walk be used as a measure of deposited charge in silicon detectors?", Internal LBL note, May 1991).

In a prior information-based undersampling pulse energy acquisition system, an accurate pulse model and pulse characteristics description is an important condition to obtain pulse information precisely. However in practice, a pulse physical model and pulse characteristics are not only determined by a detector, but also relevant to a distribution parameter of a reading circuit of the pulse. Therefore it is very difficult to build an accurate pulse model and describe accurate pulse characteristics. When the pulse model and characteristic parameter applied in the process of practical fitting or estimation deviate from an ideal model and a characteristic parameter, the pulse energy information obtained based on prior information may have errors.

Therefore, it is necessary to put forward a method for digitalizing a scintillation pulse in ionizing radiation detection to overcome the above defects.

SUMMARY OF THE INVENTION

In view of the above, the objective of the present disclosure is to provide a method for digitalizing a scintillation pulse in ionizing radiation detection. With the method, the problem of inaccurate energy measurement caused by inaccuracy of a fitting model or pulse characteristics description in a prior information-based undersampling pulse energy information acquisition system can be solved.

In order to attain the foregoing objective, a method for digitalizing a scintillation pulse is provided in the present disclosure, and the method includes step S1-S5 in the following.

In step S1, a pulse database outputted by a detector irradiated by rays of different energy is acquired.

In step S2, each of pulses in the pulse database obtained in S1 is sampled and quantized to acquire complete energy information included in the pulse.

In step S3, each of the pulses in the pulse database obtained in S1 is undersampled and quantized, and pulse prior information is used to estimate or fit energy information.

In step S4, with the energy information obtained in S2 as a standard, the mapping relationship between the energy information obtained by a prior information-based undersampling pulse energy acquisition method and the energy information obtained by the method of S2 is determined.

In step S5, the energy mapping relationship obtained in S4 is utilized to correct the energy information obtained by the prior information-based undersampling pulse energy acquisition method.

In the above method for digitalizing a scintillation pulse, preferably, the detector in the step S1 is a gas detector or a scintillation detector or a semi-conductor detector.

In the above method for digitalizing a scintillation pulse, preferably, the step S1 of acquiring a pulse database outputted by a detector irradiated by rays of different energy is performed by means of simulation or/and direct collection.

In the above method for digitalizing a scintillation pulse, preferably, if the step S1 of acquiring a pulse database outputted by a detector irradiated by rays of different energy is performed by means of simulation, the step S1 includes:

(a): irradiating the detector by an energy-known ray source, collecting, by an ADC, a group or multiple groups of pulse signals to obtain a pulse set, and generating an average pulse by using the pulse set; and (b): scaling the average pulse to simulate and acquire the pulse database generated by the detector irradiated by rays within a certain range of energy.

In the above method for digitalizing a scintillation pulse, preferably, the generating an average pulse includes: firstly making an energy spectrum for the group of pulses; fitting a photoelectric peak in the energy spectrum by a Gaussian function; selecting all pulses whose energy values are within a scope of full width at half maximum of the acquired fitted Gaussian function; obtaining the average pulse $P_m$ as a set of $$\left[ \frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m} \right],$$

where m denotes the number of all the selected pulses, $S_{(k,i)}$ denotes the k-th ADC sampling point of the i-th pulse, i is an integer and $0<i<m$, k is an integer and $0<k\leq h$, and h denotes the number of ADC sampling points.

In the above method for digitalizing a scintillation pulse, preferably, the scaling an average pulse is performed by means of linear scaling or non-linear scaling.

In the above method for digitalizing a scintillation pulse, preferably, the linear scaling of the average pulse includes: calculating a maximum times needed for amplifying a pulse signal as:

$$A = \frac{E_u}{E_s};$$

and calculating a scaled pulse set $P_a$ as:

$$P_a = \left\{ P_m \cdot \frac{A}{N}, P_m \cdot \frac{2A}{N}, P_m \cdot \frac{3A}{N}, \ldots, P_m \cdot A \right\},$$

where $E_s$ denotes ray energy corresponding to an average pulse $P_m$ obtained in the step S1, $E_u$ denotes an upper limit of energy of to-be-detected ray determined by a user according to an actual application requirement, and N denotes a total number of the scaled pulses.

In the above method for digitalizing a scintillation pulse, preferably, the non-linear scaling of the average pulse includes: determining a non-linear energy response curve $y=f(x)$ of the detector; calculating a maximum times needed for amplifying a pulse signal as:

$$A = \frac{E_u}{E_s};$$

and determining a scaled pulse set $P_a$ corresponding to the detector as $$P_a = \left\{ P_m \cdot f\left(\frac{A}{N}\right), P_m \cdot f\left(\frac{2A}{N}\right), P_m \cdot f\left(\frac{3A}{N}\right), \ldots, P_m \cdot f(A) \right\},$$

where $E_s$ denotes ray energy corresponding to the average pulse $P_m$ obtained in step S1, $E_u$ denotes an upper limit of energy of to-be-detected ray determined by a user according to an actual application requirement, and N denotes a total number of the scaled pulses.

In the above method for digitalizing a scintillation pulse, preferably, if the step S1 of acquiring a pulse database outputted by a detector irradiated by rays of different energy is performed by means of direct collection, the step S1 includes: irradiating the detector by using multiple ray sources with different energy according to a user requirement; and collecting directly, by an ADC, outputted pulses to obtain a pulse set with energy distributed within a certain range.

In the above method for digitalizing a scintillation pulse, preferably, if the step S1 of acquiring a pulse database outputted by a detector irradiated by rays of different energy is performed by combining simulation and direct collection, the step S1 includes: firstly irradiating, by multiple energy-known ray sources, the detector respectively to obtain respective average pulses, and simulating with an interpolation method to acquire the pulse database generated by the detector irradiated by rays within a certain range of energy.

In the above method for digitalizing a scintillation pulse, preferably, the generating an average pulse includes: firstly making an energy spectrum for the group of pulses; fitting a photoelectric peak in the energy spectrum by a Gaussian function; selecting all pulses whose energy values are within a scope of full width at half maximum of the fitted Gaussian function, i.e., selecting all pulses whose energy value are located within the scope of full width at half maximum of the photoelectric peak from the pulse database; obtaining the average pulse $P_m$ as a set of $$\left[\frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m}\right],$$

where m denotes the number of all the selected pulses, $S_{(k,i)}$ denotes the k-th ADC sampling point of the i-th pulse, i is an integer and $0<i \leq m$, k is an integer and $0<k \leq h$, and h denotes the number of ADC sampling points.

In the above method for digitalizing a scintillation pulse, preferably, the acquiring complete energy information included in a pulse in the step S2 includes: directly digitalizing the pulse to acquire the complete energy information included in the pulse, or sampling a physical quantity which can represent the pulse energy information to indirectly acquire the complete energy information included in the pulse.

In the above method for digitalizing a scintillation pulse, preferably, if the step of acquiring complete energy information included in the pulse is performed by directly digitalizing the pulse, the step includes: critical/over-sampling the pulse by an analog-to-digital scheme or a multi-voltage threshold scheme; and acquiring the pulse energy information by a numerical integration method, or acquiring the maximum voltage amplitude in sampling points to represent the energy information.

In the above method for digitalizing a scintillation pulse, preferably, if the step of acquiring complete energy information included in the pulse is performed by directly digitalizing a pulse, then the step includes: firstly holding a peak value by a peak-holding circuit, then sampling a voltage amplitude of a sampling peak point to represent the pulse energy information.

In the above method for digitalizing a scintillation pulse, preferably, if the step of acquiring complete energy information included in the pulse is performed by means of indirect sampling, then the step includes converting a pulse amplitude to a time width by a Wilkinson converting method.

In the above method for digitalizing a scintillation pulse, preferably, the digitalization method of undersampling and quantizing each of the pulses in the step S3 is performed by using an analog-to-digital converter or using a comparator in cooperation with a time-to-digital converter.

In the above method for digitalizing a scintillation pulse, preferably, the estimating or fitting energy information in the step S3 is performed by a MVT method. The step of calculating pulse energy by the MVT method includes: firstly setting multiple voltage thresholds; inputting pulses and the voltage thresholds respectively to a comparator; measuring a time when a turnover logic pulse is outputted by the comparator, where the measured time value and a corresponding voltage threshold compose an MVT sampling point; fitting and rebuilding a pulse by using the MVT sampling point and a pulse model; and performing definite integration on the rebuilt pulse or performing numerical integration on the rebuilt pulse after re-sampling to obtain the pulse energy information.

In the above method for digitalizing a scintillation pulse, preferably, the estimating or fitting energy information in the step S3 is performed by an ADC fitting method. The step of calculating pulse energy by the ADC fitting method includes: sampling a pulse signals by an ADC to obtain ADC sampling points; fitting and rebuilding a pulse by utilizing the ADC sampling points and a pulse model; and performing definite integration on the rebuilt pulse or performing numerical integration on the rebuilt pulse after re-sampling to obtain pulse energy information.

In the above method for digitalizing a scintillation pulse, preferably, the estimating or fitting energy information in the step S3 is performed by an empirical Bayesian estimation method. the step of calculating pulse energy by the empirical Bayesian estimation method includes: acquiring digitalized pulse sampling points; and solving a maximum-likelihood solution of given digital samples as the estimated pulse energy information by utilizing the Bayesian theory and independence assumption.

In the above method for digitalizing a scintillation pulse, preferably, the estimating or fitting energy information in the step S3 is performed by a time over threshold (TOT) method. The step of calculating pulse energy by the TOT method includes: estimating an expected energy value of a pulse as the pulse energy information by fitting a relationship between TOT and pulse energy.

In the above method for digitalizing a scintillation pulse, preferably, the energy mapping relationship in the step S5 is a coefficient look-up table or an energy mapping function.

In the above method for digitalizing a scintillation pulse, preferably, if the energy mapping relationship in the step S5 is a coefficient look-up table, a method for calculating a correction coefficient C includes: calculating the correction coefficient as $$C_i = \frac{E_{(standard,i)}}{E_{(statistical,i)}},$$

where for each of the pulses in the pulse database $P_a$, $E_{(standard,i)}$ denotes energy obtained by a complete energy information acquisition method, and $E_{(statistical,i)}$ denotes energy obtained by a prior information-based undersampling pulse energy acquisition method, i is an integer and $0<i \leq N$.

In the above method for digitalizing a scintillation pulse, preferably, the corrected energy $E_{CStatistical}$ in the step S5 is calculated by a formula: $E_{CStatistical} = C * E_{statistical}$.

According to the above method for digitalizing a scintillation pulse, preferably, if the energy mapping relationship in the step S4 is a mapping function $y=g(x)$, derivation of the function includes: acquiring multiple coefficient mapping points of the complete energy information acquisition method and the prior information-based undersampling pulse energy acquisition method as $$C_i = \frac{E_{(standard,i)}}{E_{(statistical,i)}},$$

where for each of the pulses in the pulse database $P_a$, $E_{(standard,i)}$ denotes energy obtained by the complete energy information acquisition method, and $E_{(statistical,i)}$ denotes energy obtained by the prior information-based undersampling pulse energy acquisition method, i is an integer and $0<i\le N$; and obtaining the mapping function $y=g(x)$ by means of curve fitting using the coefficient mapping points.

In the above method for digitalizing a scintillation pulse, preferably, the corrected energy $E_{CStatistical}$ in the step S5 is calculated as $E_{CStatistical}=gE_{(statistical)}$.

Compared to the prior art, the foregoing technical solutions have advantages 1-19 as follows.

1. A method for digitalizing a scintillation pulse includes: step S1, acquiring a pulse database outputted by a detector irradiated by rays of different energy; step S2, sampling and quantizing each of the pulses in the pulse database of the step S1, to acquire complete energy information included in the pulse; step S3, undersampling and quantizing each of the pulses in the pulse database obtained in the step S1, and estimating or fitting energy information by using pulse prior information; step S4, with the energy information obtained in the step S2 as a standard, determining the mapping relationship between the energy information obtained by a prior information-based undersampling pulse energy acquisition method and the energy information obtained by the method of the step S2; and step S5, utilizing the energy mapping relationship to correct the energy information obtained by the prior information-based undersampling pulse energy acquisition method. It can be seen from the above technical solutions that, since the pulse model and characteristics description have no effect on the accuracy of a complete energy information acquisition method, the correction method for pulse energy information in the present disclosure is to use the pulse energy information obtained by a complete energy information acquisition method as a standard to determine the mapping relationship between the pulse energy obtained by the prior information-based undersampling pulse energy acquisition method and the complete energy information acquisition method, and use the energy mapping relationship to correct energy measuring errors caused by inaccurate pulse model and characteristic description in the prior information-based undersampling pulse energy acquisition method.

2. The detector in the step S1 is a gas detector or a scintillation detector or a semi-conductor detector, or any other detector which is appropriate for pulse energy acquisition in ionizing radiation detection. The gas detector utilizes ionization effect of a ray in gas medium to realize conversion from ray to current, having advantages of simple preparation, stable and reliable performance, convenient use, and low cost. The scintillation detector utilizes luminescent effect of a ray in a scintillation crystal to realize the conversion from ray to light photon, having advantages of high detection efficiency, good energy response linearity, short response time and easy manufacturing. The semi-conductor detector utilizes the principle of creating electron hole pairs when a ray is in a semi-conductor to realize the conversion from ray to electric signal, having advantages of high energy resolution and wide measurable linear range.

3. If the step S1 of acquiring a pulse database outputted by a detector irradiated by rays of different energy in the step S1 is performed by simulation, the detailed process is: (a) irradiating the detector by an energy-known ray source, collecting, by an ADC, a group or multiple groups of pulse signals to obtain a pulse set, and generating an average pulse by using the pulse set; and (b) scaling the average pulse to stimulate and acquire the pulse database generated by the detector irradiated by rays within a certain range of energy. The scaling the average pulse is performed by means of linear scaling or non-linear scaling. By means of software simulation in this technical solution, the pulse database outputted by a detector irradiated by rays of different energy is acquired just using one single ray by utilizing the nature that the same detector irradiated by rays of different energy outputs pulses with the same characteristics. Meanwhile, the method is simple and flexible, and is easy to realize without adding any hardware.

4. The generating an average pulse includes: firstly making an energy spectrum for the group of pulses, fitting the photoelectric peak in the energy spectrum by a Gaussian function, and selecting all pulses whose energy values are within the scope of full width at half maximum of the fitted Gaussian function. Supposing the number of all of the selected pulses is denoted as m and defining $S_{(k,i)}$ as the k-th ADC sampling point of the i-th pulse, where i is an integer and $0<i\le m$, k is an integer and $0<k\le h$, and h is the number of ADC sampling points, the average pulse is defined as a set of $$\left[\frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m}\right].$$

The average pulse generated by this technical solution represents a standard pulse of the detector used in the experiment, which greatly restrains pulse noise, effectively decreases the effect of noise superimposed on the pulse on the process of scaling the average pulse. The average pulse can be considered as an ideal pulse in the sense of statistics. Also, the accuracy of a standard waveform is improved with the increase of the number m of total pulses within the scope of full width at half maximum.

5. The way of linear scaling an average pulse is as follows. Supposing the ray energy corresponding to the average pulse $P_m$ obtained in step S1 is denoted as $E_s$, the upper limit of energy of to-be-detected ray determined by a user according to an actual application is denoted as $E_u$, and the total number of the scaled pulses is denoted as N, the maximum times needed for amplifying a pulse signal is calculated as:

$$A = \frac{E_u}{E_s},$$

and then a scaled pulse set $P_a$ is calculated by the formula:

$$P_a = \left\{P_m \cdot \frac{A}{N}, P_m \cdot \frac{2A}{N}, P_m \cdot \frac{3A}{N}, \ldots, P_m \cdot A\right\}.$$

With the linear scaling of the average pulse in this technical solution, the detector can be supposed as an ideal linear detector within a certain energy scope, so that the outputted pulses with different energy follows a strict linear rule, thereby making the correction method more simple and convenient to realize.

6. The non-linear scaling of the average pulse is as follows. Firstly a non-linear energy response curve y=f(x) of the detector is determined. Supposing the ray energy corresponding to the average pulse $P_m$ obtained in step S1 is denoted as $E_s$, the upper limit of energy of to-be-detected ray determined by a user according to an actual application requirement is denoted as $E_u$, and the total number of the scaled pulses is denoted as N, the maximum times needed for amplifying a pulse signal is calculated as:

$$A = \frac{E_u}{E_s},$$

and then a scaling pulse collection $P_a$ corresponding to the detector is determined as:

$$P_a = \left\{ P_m \cdot f\left(\frac{A}{N}\right), P_m \cdot f\left(\frac{2A}{N}\right), P_m \cdot f\left(\frac{3A}{N}\right), \ldots, P_m \cdot f(A) \right\}.$$

The non-linear scaling of the average pulse in this technical solution can reflect a state of a real detector, and decrease the effect of non-linearity of the detector on final correction results.

7. If the step S1 of acquiring a pulse database outputted by a detector irradiated by rays of different energy is performed by means of direct collection, the detailed process is: irradiating the detector by multiple ray sources with different energy according to a user requirement; and collecting directly, by an ADC, outputted pulses to obtain a pulse set with energy distributed within a certain range. By using the way of direct collection in this technical solution to acquire the pulse set in a wide energy scope outputted by the detector, the pulse characteristics of different energy ray sources can be truly reflected, which decreases loss of pulse information.

8. If the step S1 of acquiring a pulse database outputted by a detector irradiated by rays of different energy is performed by combining simulation and direct collection, the detailed process is: firstly irradiating, by multiple energy-known ray sources, the detector respectively to acquire respective average pulse, and simulating with an interpolation method to acquire the pulse database generated by the detector irradiated by rays within a certain range of energy. The way of combining simulation and direct collection in this technical solution has both the simplicity and convenience of the simulation method and the reality and completeness of pulse information acquired by way of direct collection.

9. The way of generating an average pulse is as follows. Firstly an energy spectrum is made for the group of pulses. The photoelectric peak in the energy spectrum is fit by a Gaussian function. Then all pulses whose energy values are located within the scope of full width at half maximum of the fitted Gaussian function are selected. Supposing the number of all of the selected pulses is denoted as m, and defining $S_{(k,i)}$ as the k-th ADC sampling point of the i-th pulse, where i is an integer and $0<i \leq m$, k is an integer and $0<k \leq h$, and h is the number of ADC sampling points, the average pulse is defined as a set:

$$\left[ \frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m} \right].$$

The average pulse generated in this technical solution represents a standard pulse of the detector used in the experiment, which greatly restrains pulse noise, and effectively decreases the effect of noise superimposed on the pulse on the process of scaling average pulse. The average pulse can be considered as an ideal pulse in the sense of statistics. In addition, the accuracy of a standard waveform is improved with the increase of number of total pulses m within the scope of full width at half maximum.

10. If the acquiring complete energy information included in the pulse is performed by way of directly digitalizing the pulse, then the steps may be performed by applying an analog-to-digital conversion scheme or a multi-voltage threshold scheme to critical/over-sample pulses, and then performing a numerical integration method to acquire the pulse energy information, or using the maximum voltage amplitude in sampling points to represent the energy information. The analog-to-digital conversion scheme like a high sampling rate ADC or the like is utilized in this technical solution to directly digitalize pulse to obtain a "complete data set" of the pulse, and the digital signal records all information of the pulse signal. By using this method to acquire pulse energy information, it can be guaranteed that the acquired energy information is sufficiently accurate.

11. If the acquiring complete energy information included in the pulse is performed by way of directly digitalizing the pulse, then the steps may be performed by firstly using a peak-holding circuit to hold peak value, and then sampling a voltage amplitude of a sampling peak point to represent the pulse energy information. With the direct digitalization method in the technical solution, pulse signal is shaped as a slow speed signal by the peak-holding circuit, then a low sampling rate analog-to-digital conversion device may be used to sample the pulse voltage amplitude. The energy information acquired by this way is very accurate.

12. If the acquiring complete energy information included in the pulse is performed by way of directly digitalizing the pulse, then the steps may be performed by converting a pulse amplitude to a time width using a Wilkinson converting method. The indirect sampling method using the Wilkinson converting is adopted in this technical solution to play its good characteristic of differential non-linearity. A high speed and high precision analog-to-digital conversion can be realized by using an improved Wilkinson method to ensure the accuracy of the acquired complete energy information.

13. The digitalization method of undersampling and quantizing each of the pulses in the pulse database in the step S3 is performed by using the analog-to-digital converter or by using a comparator in cooperation with a time-to-digital converter. Using an analog-to-digital converter is the most common method to realize digitalization. Especially with the advanced technology of large-scale integrated circuit, the process of digitalizing an analog signal can be realized only by using a very small-sized chip. In the way of using a comparator in cooperation with a time-to-digital converter to realize digitalization, which is represented by the MVT method, sampling information of a rapidly changing signal like a scintillation pulse can be acquired quite easily, which has a big advantage in cost and power consumption over the ADC sampling at equal time intervals.

14. The method of estimating or fitting energy information in the step S3 may be a MVT method. The way of calculating pulse energy by means of the MVT method includes: firstly setting multiple voltage thresholds; inputting the pulse and the voltage thresholds respectively to a comparator; measuring a time when a turnover logic pulse is outputted by the comparator, where the measured time value and corresponding voltage threshold compose an MVT sampling point; using the MVT sampling point and a pulse model to fit and rebuild the pulse; and performing definite integration on the rebuilt pulse or performing numerical integration on the rebuilt pulse after resampling to obtain the pulse energy information. In this technical solution, multiple voltage thresholds are set to easily and flexibly record time information corresponding to different voltages, and pulse energy characteristics are restored by utilizing a characteristic model of pulse, thereby effectively overcoming the defect of insufficient sampling rate when a rapid and steep signal is sampled by the equal time interval sampling method.

15. The method of estimating or fitting energy information in the step S3 may be an ADC fitting method. The way of calculating pulse energy by means of the ADC fitting method includes: using an ADC to sample a pulse signal to obtain ADC sampling points; utilizing the ADC sampling points and a pulse model to fit and rebuild the pulse; and performing definite integration on the rebuilt pulse or performing numerical integration on the rebuilt pulse after resampling to obtain the pulse energy information. In this way, a few of sampling points and a pulse characteristic model are used to restore pulse energy characteristic, making it possible to utilize the fast-developing DSP technology to simplify the hardware of the system and reduce the cost.

16. The method of estimating or fitting energy information in the step S3 may be an empirical Bayesian estimation method. The specific way of calculating pulse energy by means of the empirical Bayesian estimation method includes: acquiring digitalized pulse sampling points, and solving a maximum-likelihood solution of given digital samples as the estimated pulse energy information by utilizing the Bayesian theory and independence assumption. In this technical solution, by effectively extracting and precisely describing statistic characteristic of a pulse, the relationship between system parameter and pulse information is built in a quantitative manner, and the accuracy of calculated pulse energy is maximized by using a statistic model with fluctuation relationship.

17. The method of estimating or fitting energy information in the step S3 may be a TOT method. The specific way of calculating pulse energy by means of the TOT method includes: estimating an expected energy value of a pulse as the pulse energy information by fitting a relationship between TOT and pulse energy. In the present technical solution, no additional wave-shaping and filtering circuit or peak detecting and holding circuit needs to be added, analog front end electronics can be quite simple and is convenient for multichannel integration.

18. If the energy mapping relationship in the step S5 is a coefficient look-up table, the calculation method of the correction coefficient C is as follows. Supposing for each of the pulses in the pulse database $P_a$, the energy obtained by a complete energy information acquisition method is denoted as $E_{(standard,i)}$, and the energy obtained by a prior information-based undersampling pulse energy acquisition method is denoted as $E_{(statistical,i)}$, where i is an integer and $0<i\le N$, the correction coefficient is calculated as:

$$C_i = \frac{E_{(standard,i)}}{E_{(statistical,i)}}.$$

The corrected energy $E_{CStatistical}$ acquired in the step S5 is calculated by the formula: $E_{CStatistical}=C*E_{statistical}$. By building a coefficient look-up table in this technical solution, the correction coefficient corresponding to energy to be corrected can be determined rapidly and precisely. The algorithm is simple and can be realized on most of hardware platforms with low resource occupation.

19. If the energy mapping relationship in the step S4 is a mapping function $y=g(x)$, then the derivation of the function is as follows. Supposing for each of the pulses in the pulse database $P_a$, the energy obtained by a complete energy information acquisition method is denoted as $E_{(standard,i)}$, and the energy obtained by a prior information-based undersampling pulse energy acquisition method is denoted as $E_{(statistical,i)}$, where i is an integer and $0<i\le N$, multiple coefficient mapping points of the complete energy information acquisition method and the prior information-based undersampling pulse energy acquisition method can be obtained by the formula:

$$C_i = \frac{E_{(standard,i)}}{E_{(statistical,i)}}.$$

By utilizing the coefficient mapping points, the mapping function $y=g(x)$ can be obtained by curve fitting. The corrected energy $E_{CStatistical}$ acquired in the step S5 is calculated by the formula: $E_{CStatistical}=g(E_{statistical})$. By using the way of curve fitting in this technical solution, the superimposed calculation error on a single coefficient mapping point is decreased, thereby making the correction process more steadily.

DETAILED DESCRIPTION OF THE EMBODIMENTS

The present disclosure provides a method for digitalizing a scintillation pulse in ionizing radiation detection, which can solve the problem of inaccurate energy measurement caused by inaccuracy of a fitting model or pulse characteristic description in a prior information-based undersampling pulse energy information acquisition system.

Figure 1:
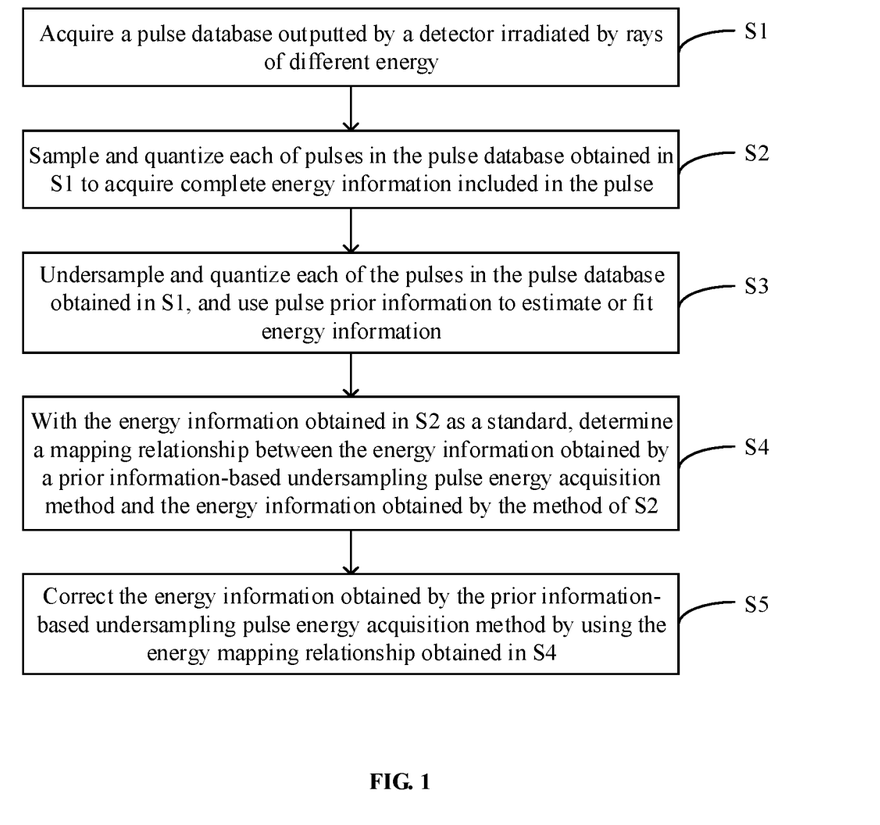
FIG. 1 is a flow chart of a method for correcting energy information obtained by a prior information-based undersampling pulse energy acquisition method in ionizing radiation detection provided in the present disclosure.

Referring to FIG. 1, a method for digitalizing a scintillation pulse provided in the present disclosure includes step S1 to step S5 in the following.

In step S1, a pulse database outputted by a detector irradiated by rays of different energy is acquired.

In step S2, each of pulses in the pulse database obtained in S1 is sampled and quantized to acquire complete energy information included in the pulse.

In step S3, each of the pulses in the pulse database obtained in S1 is undersampled and quantized, and pulse prior information is used to estimate or fit energy information.

In step S4, with the energy information obtained in S2 as a standard, the mapping relationship between the energy information obtained by a prior information-based undersampling pulse energy acquisition method and the energy information obtained by the method of S2 is determined.

In step S5, the energy information obtained by the prior information-based undersampling pulse energy acquisition method is corrected by using the energy mapping relationship obtained in S4.

Since the pulse model and characteristic description have no effect on the accuracy of a complete energy information acquisition method, the correction method for pulse energy information in the present disclosure is to use the pulse energy information obtained by a complete energy information acquisition method as a standard to determine the mapping relationship between the pulse energy obtained by the prior information-based undersampling pulse energy acquisition method and the complete energy information acquisition method, and use the energy mapping relationship to correct the energy measuring errors caused by inaccurate pulse model and characteristic description in the prior information-based undersampling pulse energy acquisition method.

The detector in the step S1 is any detector which is appropriate for pulse energy acquisition in ionizing radiation detection, such as a gas detector, a scintillation detector or a semi-conductor detector, or any other detector which is appropriate for pulse energy acquisition in ionizing radiation detection. The gas detector utilizes ionization effect of a ray in gas medium to realize conversion from ray to current, having advantages of simple preparation, stable and reliable performance, convenient use and low cost. The scintillation detector utilizes luminescent effect of a ray in a scintillation crystal to realize the conversion from ray to light photon, having advantages of high detection efficiency, good energy response linearity, short response time and easy manufacturing. The semi-conductor detector utilizes the principle of creating electron hole pairs when a ray is in a semi-conductor to realize the conversion from ray to electric signal, having advantages of high energy resolution and wide measurable linear range.

The step S1 of acquiring a pulse signal outputted by a detector irradiated by rays of different energy may be performed by mean of simulation to generate the pulse database outputted by the detector irradiated by rays of different energy, or by directly collecting the pulse database outputted by the detector irradiated by multiple ray sources, or by a combination of the two methods above.

If the step S1 of acquiring a pulse database outputted by a detector irradiated by rays of different energy in the step S1 is performed by simulation, the detailed process is: (a) using an energy-known ray source to irradiate the detector, utilizing an ADC to collect a group or several groups of pulse signals to obtain a pulse set, and generating an average pulse by using the pulse set; and (b) scaling the average pulse to stimulate and acquire the pulse database generated by the detector irradiated by rays within a certain range of energy. The scaling the average pulse is performed by means of linear scaling or non-linear scaling.

By means of software simulation, the pulse database outputted by a detector irradiated by rays of different energy is acquired just using one single ray by utilizing the nature that the same detector irradiated by rays of different energy outputs pulses with the same characteristics. Meanwhile, the method is simple and flexible, and is easy to realize without adding any hardware.

In the foregoing (a), the generating an average pulse includes: firstly making an energy spectrum for the group of pulses, fitting the photoelectric peak in the energy spectrum by a Gaussian function, and selecting all pulses whose energy values are within the scope of full width at half maximum of the fitted Gaussian function. Supposing the number of all of the selected pulses is denoted as m and defining $S_{(k,i)}$ as the k-th ADC sampling point of the i-th pulse, where i is an integer and $0<i\le m$, k is an integer and $0<k\le h$, and h is the number of ADC sampling points, the average pulse is defined as a set of $$\left[\frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m}\right].$$

The average pulse generated by this way represents a standard pulse of the detector used in the experiment, which greatly restrains pulse noise, effectively decreases the effect of noise superimposed on the pulse on the process of scaling the average pulse. The average pulse can be considered as an ideal pulse in the sense of statistics. Also, the accuracy of a standard waveform is improved with the increase of the number m of total pulses within the scope of full width at half maximum.

In the foregoing (b), the way of linear scaling an average pulse is as follows. Supposing the ray energy corresponding to the average pulse $P_m$ obtained in step S1 is denoted as $E_s$, the upper limit of energy of to-be-detected ray determined by a user according to an actual application is denoted as $E_u$, and the total number of the scaled pulses is denoted as N, the maximum times needed for amplifying a pulse signal is calculated as:

$$A = \frac{E_u}{E_s},$$

and then a scaled pulse set $P_a$ is calculated by the formula:

$$P_a = \left\{P_m \cdot \frac{A}{N}, P_m \cdot \frac{2A}{N}, P_m \cdot \frac{3A}{N}, \ldots, P_m \cdot A\right\}.$$

With the linear scaling of the average pulse, the detector can be supposed as an ideal linear detector within a certain energy scope, so that the outputted pulses with different energy follows a strict linear rule, thereby making the correction method more simple and convenient to realize.

In the foregoing (b), the non-linear scaling of the average pulse is as follows. Firstly a non-linear energy response curve y=f(x) of the detector is determined. Supposing the ray energy corresponding to the average pulse $P_m$ obtained in step S1 is denoted as $E_s$, the upper limit of energy of to-be-detected ray determined by a user according to an actual application requirement is denoted as $E_u$, and the total number of the scaled pulses is denoted as N, the maximum times needed for amplifying a pulse signal is calculated as:

$$A = \frac{E_u}{E_s},$$

and then a scaling pulse collection $P_a$ corresponding to the detector is determined as:

$$P_a = \left\{ P_m \cdot f\left(\frac{A}{N}\right), P_m \cdot f\left(\frac{2A}{N}\right), P_m \cdot f\left(\frac{3A}{N}\right), \ldots, P_m \cdot f(A) \right\}.$$

The non-linear scaling of the average pulse can reflect a state of a real detector, and decrease the effect of non-linearity of the detector on final correction results.

If the step S1 of acquiring a pulse database outputted by a detector irradiated by rays of different energy is performed by means of direct collection, the detailed process is: irradiating the detector by using multiple ray sources with different energy according to a user requirement; and collecting directly, by an ADC, outputted pulses to obtain a pulse set with energy distributed within a certain range. By using the way of direct collection to acquire the pulse set in a wide energy scope output by the detector, the pulse characteristics of different energy ray sources can be truly reflected, which decreases loss of pulse information.

If the step S1 of acquiring a pulse database outputted by a detector irradiated by rays of different energy is performed by combining simulation and direct collection, the detailed process is: firstly irradiating, by multiple energy-known ray sources, the detector respectively to acquire respective average pulse, and simulating with an interpolation method to acquire the pulse database generated by the detector irradiated by rays within a certain range of energy. The way of combining simulation and direct collection has both the simplicity and convenience of the simulation method and the reality and completeness of pulse information acquired by way of direct collection.

The way of generating an average pulse is as follows. Firstly an energy spectrum is made for the group of pulses. The photoelectric peak in the energy spectrum is fit by a Gaussian function. Then all pulses whose energy values are located within the scope of full width at half maximum of the fitted Gaussian function are selected, i.e., all pulses whose energy values are located within the scope of full width at half maximum of the photoelectric peak are selected. Supposing the number of all of the selected pulses is denoted as m, and defining $S_{(k,i)}$ as the k-th ADC sampling point of the i-th pulse, where i is an integer and $0<i\leq m$, k is an integer and $0<k\leq h$, and h is the number of ADC sampling points, the average pulse is defined as a set:

$$\left[ \frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m} \right].$$

The average pulse generated in this way represents a standard pulse of the detector used in the experiment, which greatly restrains pulse noise, and effectively decreases the effect of noise superimposed on the pulse on the process of scaling average pulse. The average pulse can be considered as an ideal pulse in the sense of statistics. In addition, the accuracy of a standard waveform is improved with the increase of number of total pulses m within the scope of full width at half maximum.

The way of acquiring complete energy information included in the pulse after digitalizing a pulse (hereinafter referred to as complete energy information acquisition method) in the step S2 may be directly digitalizing the pulse to acquire the complete energy information included in the pulse, or may be sampling the physical quantity which can represent the pulse energy information to indirectly acquire the complete energy information included in the pulse.

If the complete energy information acquisition method in the step S2 is performed by way of directly digitalizing a pulse to acquire complete energy information included in the pulse, then the steps may be performed by firstly applying an analog-to-digital conversion scheme or a multi-voltage threshold scheme to critical/over-sample pulses, and then performing a numerical integration method to acquire the pulse energy information, or using the maximum voltage amplitude in sampling points to represent the energy information. The analog-to-digital conversion scheme like a high sampling rate ADC or the like is utilized to directly digitalize pulse to obtain a "complete data set" of the pulse, and the digital signal records all information of the pulse signal. By using this method to acquire pulse energy information, it can be guaranteed that the acquired energy information is sufficiently accurate.

If the complete energy information acquisition method in the step S2 is performed by way of directly digitalizing a pulse to acquire complete energy information included in the pulse, then the steps may also be performed by firstly using a peak-holding circuit to hold peak value, and then sampling a voltage amplitude of a sampling peak point to represent the pulse energy information. With the direct digitalization method, pulse signal is shaped as a slow speed signal by a peak-holding circuit, and then a low sampling rate analog-to-digital conversion device may be used to sample the pulse voltage amplitude. The energy information acquired by this way is very accurate.

If the complete energy information acquisition method in the step S2 is performed by way of indirectly sampling to acquire complete energy information included in the pulse, then the step may be performed by converting a pulse amplitude to a time width using a Wilkinson converting method. The indirect sampling method using the Wilkinson converting is adopted to play its good characteristic of differential non-linearity. A high speed and high precision analog-to-digital conversion can be realized by using an improved Wilkinson method to ensure the accuracy of the acquired complete energy information.

The digitalization method of undersampling and quantizing each of the pulses in the pulse database in the step S3 is not limited to using the analog-to-digital converter to realize digitalization, and may be performed by using a comparator in cooperation with a time-to-digital converter to realize digitalization. Using an analog-to-digital converter is the most common method to realize digitalization. Especially with the advanced technology of large-scale integrated circuit, the process of digitalizing an analog signal can be realized only by using a very small-sized chip. In the way of using a comparator in cooperation with a time-to-digital converter to realize digitalization, which is represented by the MVT method, sampling information of a rapidly changing signal like a scintillation pulse can be acquired quite easily, which has a big advantage in cost and power consumption over the ADC sampling at equal time intervals.

The method of calculating energy information by using a statistic estimation method or a curve fitting method in the step S3 may be a MVT method. The way of calculating pulse energy by means of the MVT method includes: firstly setting multiple voltage thresholds; inputting the pulse and the voltage thresholds respectively to a comparator; measuring a time when a turnover logic pulse is outputted by the comparator, where the measured time value and corresponding voltage threshold compose an MVT sampling point; using the MVT sampling point and a pulse model to fit and rebuild the pulse; and performing definite integration on the rebuilt pulse or performing numerical integration on the rebuilt pulse after resampling to obtain the pulse energy information. In this way, multiple voltage thresholds are set to easily and flexibly record time information corresponding to different voltages, and pulse energy characteristics are restored by utilizing a characteristic model of pulse, thereby effectively overcoming the defect of insufficient sampling rate when a rapid and steep signal is sampled by the equal time interval sampling method.

The method of calculating energy information by using a statistic estimation method or a curve fitting method in the step S3 may be an ADC fitting method. Steps of calculating pulse energy by means of the ADC fitting method include: using an ADC to sample a pulse signal to obtain ADC sampling points; utilizing the ADC sampling points and a pulse model to fit and rebuild the pulse; and performing definite integration on the rebuilt pulse or performing numerical integration on the rebuilt pulse after resampling to obtain the pulse energy information. In this way, a few of sampling points and a pulse characteristic model are used to restore pulse energy characteristic, making it possible to utilize the fast-developing DSP technology to simplify the hardware of the system and reduce the cost.

The method of calculating energy information by using a statistic estimation method or a curve fitting method in the step S3 may be an empirical Bayesian estimation method. The specific way of calculating pulse energy by means of the empirical Bayesian estimation method includes: acquiring digitalized pulse sampling points, and solving a maximum-likelihood solution of given digital samples as the estimated pulse energy information by utilizing the Bayesian theory and independence assumption. In this way, by effectively extracting and precisely describing statistic characteristic of a pulse, the relationship between system parameter and pulse information is built in a quantitative manner, and the accuracy of calculated pulse energy is maximized by using a statistic model with fluctuation relationship.

The method of calculating energy information by using a statistic estimation method or a curve fitting method in the step S3 may be a TOT method. The specific way of calculating pulse energy by means of the TOT method includes: estimating an expected energy value of a pulse as the pulse energy information by fitting a relationship between TOT and pulse energy. In the present technical solution, no additional wave-shaping and filtering circuit or peak detecting and holding circuit needs to be added, analog front end electronics can be quite simple and is convenient for multichannel integration.

The energy mapping relationship in the step S5 may be a coefficient look-up table or an energy mapping function.

It is appointed that the pulse database outputted by the detector irradiated by rays of different energy is named as a wide energy scope pulse set $P_a$ no matter in which way it is acquired. If the energy mapping relationship in the step S5 is a coefficient look-up table, the calculation method of the correction coefficient C is as follows. Supposing for each of the pulses in the pulse database $P_a$, the energy obtained by a complete energy information acquisition method is denoted as $E_{(standard,i)}$, and the energy obtained by a prior information-based undersampling pulse energy acquisition method is denoted as $E_{(statistical,i)}$, where i is an integer and $0<i\leq N$, the correction coefficient is calculated as:

$$C_i = \frac{E_{(standard,i)}}{E_{(statistical,i)}}.$$

By building a coefficient look-up table, the correction coefficient corresponding to energy to be corrected can be determined rapidly and precisely. The algorithm is simple and can be realized on most of hardware platforms with low resource occupation.

If the energy mapping relationship in the step S4 is a mapping function $y=g(x)$, then the derivation of the function is as follows. Supposing for each of the pulses in the pulse database $P_a$, the energy obtained by a complete energy information acquisition method is denoted as $E_{(standard,i)}$, and the energy obtained by a prior information-based undersampling pulse energy acquisition method is denoted as $E_{(statistical,i)}$, where i is an integer and $0<i\leq N$, multiple coefficient mapping points of the complete energy information acquisition method and the prior information-based undersampling pulse energy acquisition method can be obtained by the formula:

$$C_i = \frac{E_{(standard,i)}}{E_{(statistical,i)}}.$$

By utilizing the coefficient mapping points, the mapping function $y=g(x)$ can be obtained by curve fitting. By using the way of curve fitting, the superimposed calculation error on a single coefficient mapping point is decreased, thereby making the correction process more steadily.

The energy $E_{CStatistical}$ acquired by the prior information-based undersampling pulse energy acquisition method in the step S5 is calculated by the formula: $E_{CStatistical}=C*E_{statistical}$ or $E_{CStatistical}=g(E_{statistical})$.

Technical solutions of the present disclosure are described in detail in conjunction with drawings and embodiments in the following. For the process of acquiring a pulse set output by a detector irradiated by rays of different energy, the way of simulating to generate the pulse data set, which is the simplest method among the three methods, is selected in the embodiment to explain the technical solutions. The traditional ADC scheme is adopted as the complete energy information acquisition method in the embodiment. The MVT method and the ADC fitting method are adopted as the prior information-based undersampling pulse energy acquisition method in the embodiment. Apparently the prior information-based undersampling pulse energy acquisition method is not limited to these two methods, and these two methods are only taken as specific embodiments for illustration.

In a first embodiment, a scintillation detector is used, which specifically is a NaI crystal coupled photo-multiplier tube CR105 (NaI/PMT CR105 detector). The MVT method is adopted as the prior information-based undersampling pulse energy acquisition method. The first embodiment includes the following step (1)-(5).

Figure 2:
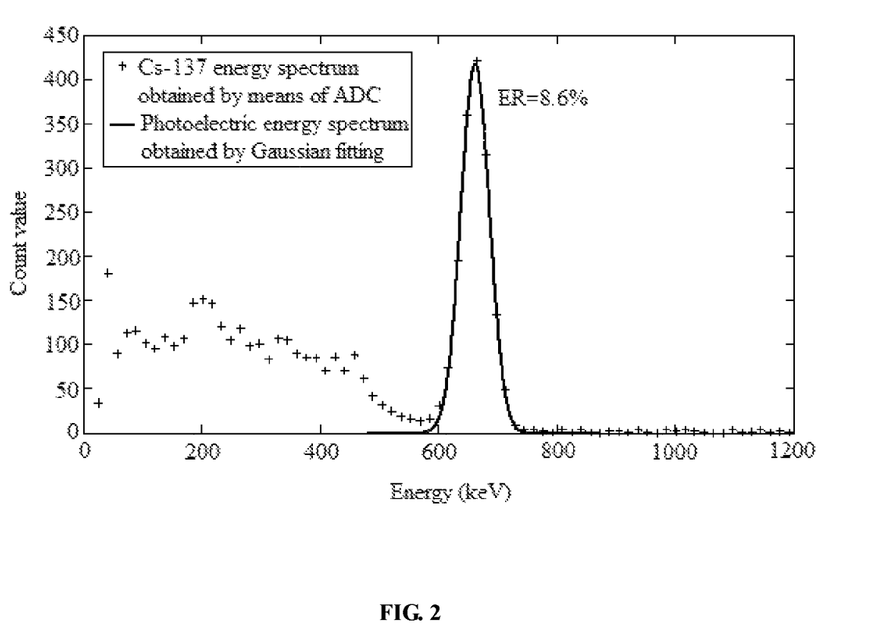
FIG. 2 is a diagram illustrating an energy spectrum obtained by a complete energy information acquisition method with a Cs-137 Gamma ray source irradiating a NaI/PMT detector and Gaussian fitting of the photoelectric peak of the energy spectrum (the photoelectric peak is corrected to 662 keV)
Figure 3:
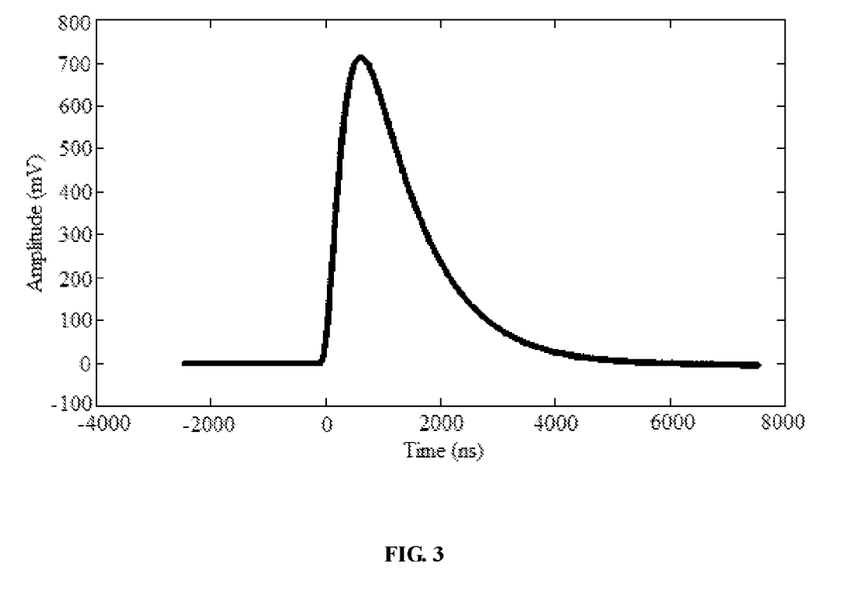
FIG. 3 is a diagram illustrating an average pulse obtained by a NaI/PMT detector under irradiation of a Cs-137 Gamma ray source.

In step (1), a Cs-137 ray source is used to irradiate a NaI/PMT detector. A scintillation pulse outputted by the detector is directly inputted into an oscilloscope. 5000 scintillation pulses are collected at a sampling rate of 10 GSPS, and an energy spectrum is counted and acquired (the peak energy is corrected to 662 keV) as shown by the dotted line in FIG. 2. A photoelectric peak of the energy spectrum is fit by a Gaussian curve, as shown by the solid line in FIG. 2, and then the energy resolution is calculated as 8.6%. A full width at half maximum value is calculated to be about 30 keV based on the energy resolution and peak energy value. Therefore the ray energy values within the scope of full width at half maximum corresponding to the peak energy of 662 keV are acquired as [632 keV, 692 keV]. All scintillation pulses within this scope are selected. Supposing the number of the selected scintillation pulses is denoted as m and defining $S_{(k,i)}$ as the k-th (k is an integer and $0<k\leq h$; h denotes the number of ADC sampling points) ADC sampling point of the i-th (i is an integer and $0<i\leq m$) pulse, average pulses $P_m$ are acquired as $$\left[\frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m}\right],$$

as shown in FIG. 3.

In step (2), the average pulse is scaled to simulate and acquire the scintillation pulse database generated by the detector irradiated by rays within a scope of [0 keV, 3 MeV]. Supposing ray energy $E_s$ corresponding to the average pulse $P_m$ obtained in the step (1) is 662 keV, and the energy upper limit $E_u$ of to-be-detected rays is 3 MeV, a maximum times needed for amplifying an scintillation pulse is calculated as:

$$A = \frac{E_u}{E_s} = 4.6.$$

Selecting a total number of scaling the pulse as N=10000, a scaled pulse set $P_a$ is calculated as:

$$P_a = \left\{P_m \cdot \frac{A}{N}, P_m \cdot \frac{2A}{N}, P_m \cdot \frac{3A}{N}, \ldots, P_m \cdot A\right\}.$$

Figure 4:
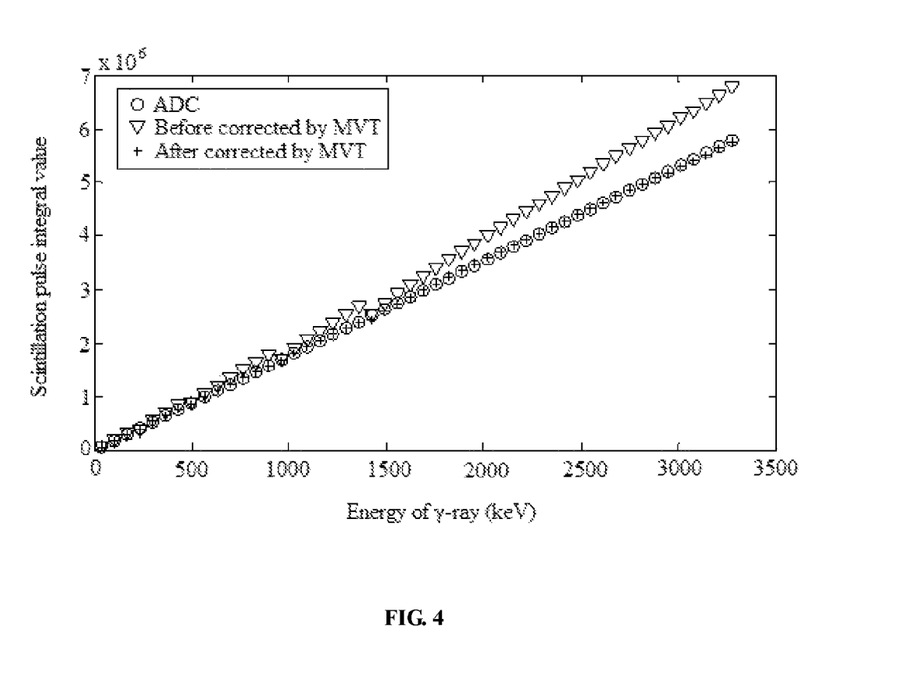
FIG. 4 is a diagram comparing the energy curves of a NaI/PMT detector before and after being corrected according to the present disclosure.

In step (3), a voltage threshold (for a setting method, refer to Patent WO2012142778A1) to be used in a MVT method is determined according to the average pulse obtained in the step (1). The MVT method is used to calculate an energy value $E_{(MVT,i)}$ for each scintillation pulse in the scaled pulse set, where i is an integer and $0<i\leq 10000$, and a scintillation pulse model in the MVT method is:

$$V(t) = \begin{cases} 0 & t < t_0, \\ V_p \frac{(t-t_0)}{(t_p-t_0)} & t_0 \leq t < t_p \\ V_p e^{-(t-t_p)/\tau} & t \geq t_p \end{cases} \quad \text{(Formula 1)}$$

where $\tau$ denotes a decay time constant of a scintillation crystal, $V_p$ denotes an amplitude of a scintillation pulse, $t_0$ denotes an event arrival time and $t_p$ denotes a pulse peak time (for detailed information, refer to Qingguo Xie, Chien-Min Kao, Zekai Hsiau, and Chin-Tu Chen, "A New Approach for Pulse Processing in Positron Emission Tomography", IEEE TRANSACTIONS ON NUCLEAR SCIENCE, VOL.52, NO.4, AUGUST 2005). In the meanwhile, voltage amplitudes of ADC sampling points of each scintillation pulse in the scaled pulse set are accumulated directly to obtain an energy value $E_{(ADC, i)}$ in a traditional ADC scheme, where i is an integer and $0<i\leq 10000$. Circles in FIG. 4 show the energy of scintillation pulses within an energy scope of [0 keV, 3 MeV] calculated by using a traditional ADC scheme.

The MVT method for acquiring scintillation pulse energy can be realized through the following Procedure ①-②.

In Procedure ①, 8 voltage threshold values are preset as [20 38 56 80 250 500 1000 1500]. A scintillation pulse outputted by the detector and the preset voltage threshold values are inputted to 8 comparators. Time information corresponding to outputting a logic level jump signals by the comparator is converted to a digital signal by using a time-to-digital converter (TDC). The TDC may be realized by a field programmable gate array (FPGA). Supposing the 16 triggering time values corresponding to outputting logic level positive jump and negative jump by the 8 comparators are: TrigTime={Tr1, Tr2, Tr3, Tr4, Tr5, Tr6, Tr7, Tr8, Td8, Td7, Td6, Td5, Td4, Td3, Td2, Td1}; where Tr1, Tr2, Tr3, Tr4, Tr5, Tr6, Tr7 and Tr8 are rising edge sampling time triggered by 8 threshold values, while Td8, Td7, Td6, Td5, Td4, Td3, Td2 and Td1 are corresponding fall edge sampling time. In this way, 16 groups of sampling points of the MVT method are represented by {(Tr1, 20), (Tr2, 38), . . . , (Tr8, 1500), (Td8, 1500), . . . , (Td1, 20)}.

In Procedure ②, original scintillation pulses are restored with the 16 groups of sampling points obtained in the above procedure. Firstly a scintillation pulse model is built, and in this embodiment, the scintillation pulse is fitted by using a straight rising edge and an exponential fall edge (refer to Formula 1 for a specific expression). Supposing a rising edge functional equation is: yr=k*xr+b, and a fall edge functional equation is: $yd=e^{a*xd+c}$, the equations are fit and a crossing point $P(P_x, P_y)$ of the two curves are calculated by dichotomy. After rebuilding scintillation pulses, the restored scintillation pulses are re-sampled with a sampling rate of 10 GSPS which is the same as that in the step (1), and scintillation pulse energy in the MVT method is acquired by accumulating voltage amplitudes of all sampling points. Triangles shown in FIG. 4 represent energy obtained by calculation before correcting scintillation pulses within an energy scope of [0 keV, 3 MeV] by using the MVT method.

In step (4), a correction coefficient is calculated as:

$$C_i = \frac{E_{(ADC,i)}}{E_{(MVT,i)}},$$

a correction coefficient look-up table is built, or the functional mapping relationship between $E_{(MVT, i)}$ and $E_{(ADC, i)}$ is built by a fitting correction coefficient. Crosses shown in FIG. 4 represent energy obtained after correcting scintillation pulses within an energy scope of [0 keV, 3 MeV] by using the MVT method.

In step (5), a correction coefficient "C" is generated by the look-up table or functional equation obtained in the step (4), and the corrected energy is calculated as $E_{CMVT}=C*E_{MVT}$.

Figure 5:
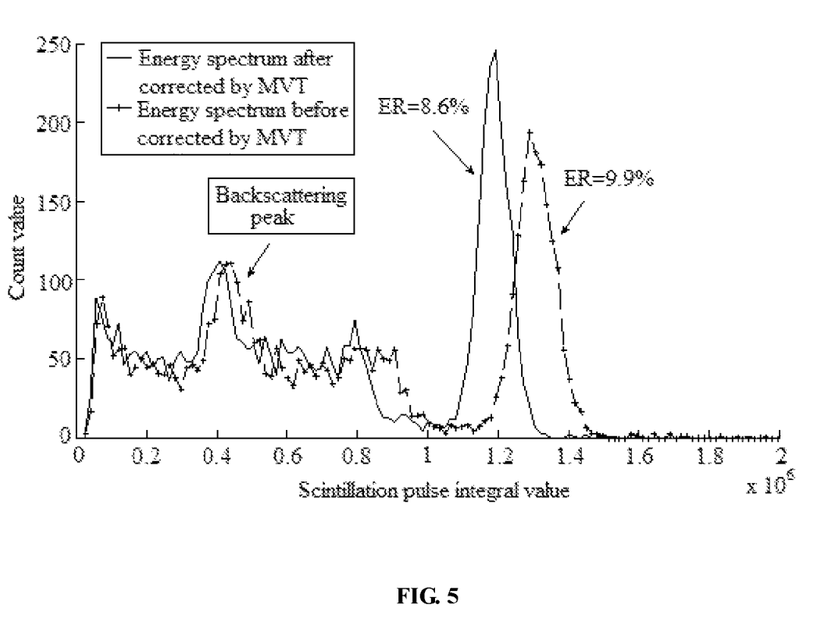
FIG. 5 is a diagram comparing energy spectrums of a NaI/PMT detector under irradiation of a Cs-137 ray source before and after being corrected according to the present disclosure.

FIG. 5 is a diagram comparing an energy spectrum of a NaI/PMT detector under irradiation of a Cs-137 ray source before and after being corrected according to the present disclosure.

In a second embodiment, a NaI/PMT detector is used, and an ADC fitting method is adopted as the prior information-based undersampling pulse energy acquisition method. The second embodiment includes the following step (1)-(4).

In step (1), a Cs-137 ray source is used to irradiate a NaI/PMT detector. A scintillation pulse outputted by the detector is directly inputted into an oscilloscope. 5000 scintillation pulses are collected at a sampling rate of 10 GSPS, and an energy spectrum is counted and acquired (the peak energy is corrected to 662 keV). A photoelectric peak of the energy spectrum is fit by a Gaussian curve, as shown by solid lines in FIG. 2, and then the energy resolution is calculated as 8.6%. A full width at half maximum value is calculated to be about 30 keV based on the energy resolution and peak energy value. Therefore the ray energy value within the scope corresponding of full width at half maximum corresponding to the peak energy of 662 keV is acquired as [632 keV, 692 keV]. All scintillation pulses within an energy scope of [632 keV, 692 keV] are selected. Supposing the number of the selected scintillation pulses is denoted as m and defining $S_{(k,i)}$ as the k-th (k is an integer and 0<k≤h; h denotes the number of ADC sampling points) ADC sampling point of the i-th (i is an integer and 0<i≤m) pulse, then an average pulse $P_m$ is acquired as $$\left[\frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m}\right].$$

In step (2), the average pulse is scaled to simulate and acquire the pulse database generated by the detector irradiated by rays within a scope of [0 keV, 3 MeV]. Supposing ray energy $E_s$ corresponding to the average pulse $P_m$ obtained in the step (1) is 662 keV, and the energy upper limit $E_u$ of to-be-detected rays is 3 MeV, a maximum times needed for amplifying a scintillation pulse is calculated as:

$$A = \frac{E_u}{E_s} = 4.6.$$

A total number of scaling the pulse is determined as: N=10000 according to actual requirements, and then a scaled pulse set $P_a$ is calculated as $$P_a = \left\{P_m \cdot \frac{A}{N}, P_m \cdot \frac{2A}{N}, P_m \cdot \frac{3A}{N}, \ldots, P_m \cdot A\right\}.$$

In step (3), an ADC fitting method is used to calculate an energy value $E_{(ADC, i)}$ for each scintillation pulse in the scaled pulse set, where i is an integer and 0<i≤10000. In the meanwhile, voltage amplitudes of ADC sampling points of each scintillation pulse in the scaled pulse set are accumulated directly to obtain energy value $E_{(ADC, i)}$ in a traditional ADC plan, where i is an integer and 0<i≤10000.

The ADC fitting method for acquiring scintillation pulse energy can be realized through the following procedure.

An ADC (denoted as ADC2) which is different from that in the step (1) is used to re-sample scintillation pulses to obtain ADC2 sampling points. Supposing that a data set of scintillation pulse sampling includes N sampling points ($t_i$, $v_i$), the scintillation pulse model in this method (for detailed information, refer to the reference document: Nan Zhang, Niraj Doshi, Mehmet Aykac, Ronald Grazioso, Michael Loope, Greg Givens, Lars Eriksson, Florian Bauer, John Young, and Matthias Schmand, "A Pulse Shape Restore Method for Event Localization in PET Scintillation Detection", Nuclear Science Symposium Conference Record, Vol.7, 2004) can be applied as:

$$V_0(t) = A_1 \times m_0 \times \left(\frac{1}{\tau_1} \times e^{-t/\tau_1} - \frac{1}{\tau_0} \times e^{-t/\tau_0}\right) \quad \text{(Formula 2)}$$

where $A_1$, $m_0$, $\tau_1$ and $\tau_0$ are parameters to be determined, $\tau_0$ denotes a time constant of crystal scintillating, $\tau_1$ denotes a time constant of a photoelectric conversion device and front end electronics. After determining the unknown parameters by performing curve fitting using the ADC2 sampling points, a scintillation pulse is rebuilt, and a scintillation pulse energy value is acquired by using definite integration or numerical integration technology.

In step (4), a correction coefficient is calculated as $$C_i = \frac{E_{(ADC,i)}}{E_{(ADC-fit,i)}};$$

a correction coefficient look-up table is built, or the functional mapping relationship between $E_{(ADC-fit, i)}$ and $E_{(ADC, i)}$ is built by a fitting correction coefficient.

A correction coefficient C is acquired by the look-up table or functional equation obtained in the step (4), and the corrected energy is calculated as $E_{CADC-fit}=C*E_{ADC-fit}$.

The invention claimed is:

1. A method for digitalizing a scintillation pulse, comprising:
    step S1, acquiring a pulse database outputted by a detector irradiated by rays of different energy;
    step S2, sampling and quantizing each of pulses in the pulse database obtained in S1 to acquire complete energy information comprised in the pulse;
    step S3, undersampling and quantizing each of the pulses in the pulse database obtained in step S1, and estimating or fitting energy information by using pulse prior information;
    step S4, with the energy information obtained in S2 as a standard, determining a mapping relationship between the energy information obtained by a prior information-based undersampling pulse energy acquisition method and the energy information obtained by the method of S2; and
    step S5, correcting the energy information obtained by the prior information-based undersampling pulse energy acquisition method by using the energy mapping relationship obtained in S4.

2. The method for digitalizing a scintillation pulse according to claim 1, wherein the detector in the step S1 is a gas detector or a scintillation detector or a semi-conductor detector.

3. The method for digitalizing a scintillation pulse according to claim 1, wherein the step S1 of acquiring a pulse database outputted by a detector irradiated by rays of different energy is performed by means of simulation or/and direct collection.

4. The method for digitalizing a scintillation pulse according to claim 3, wherein if the step S1 of acquiring a pulse database outputted by a detector irradiated by rays of different energy is performed by means of simulation, the step S1 comprises:
(a): irradiating the detector by an energy-known ray source, collecting, by an ADC, a group or a plurality of groups of pulse signals to obtain a pulse set, and generating an average pulse by using the pulse set; and
(b): scaling the average pulse to simulate and acquire the pulse database generated by the detector irradiated by rays within a certain range of energy.

5. The method for digitalizing a scintillation pulse according to claim 4, wherein the generating an average pulse comprises:
making an energy spectrum for the group of pulses;
fitting a photoelectric peak in the energy spectrum by a Gaussian function; and
selecting all pulses whose energy values are within a scope of full width at half maximum of the fitted Gaussian function; and
obtaining the average pulse $P_m$ as a set of $$\left[ \frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m} \right],$$

where m denotes the number of all the selected pulses, $S_{(k,i)}$ denotes the k-th ADC sampling point of the i-th pulse, i is an integer and $0 < i \le m$, k is an integer and $0 < k \le h$, and h denotes the number of ADC sampling points.

6. The method for digitalizing a scintillation pulse according to claim 4, wherein the scaling an average pulse is performed by means of linear scaling or non-linear scaling.

7. The method for digitalizing a scintillation pulse according to claim 6, wherein the linear scaling of the average pulse comprises:
calculating a maximum times needed for amplifying a pulse signal as:

$$A = \frac{E_u}{E_s};$$

and
calculating a scaled pulse set $P_a$ as:

$$P_a = \left\{ P_m \cdot \frac{A}{N}, P_m \cdot \frac{2A}{N}, P_m \cdot \frac{3A}{N}, \ldots, P_m \cdot A \right\},$$

wherein
$E_s$ denotes ray energy corresponding to an average pulse $P_m$ obtained in the step S1, $E_u$ denotes an upper limit of energy of to-be-detected ray determined by a user according to an actual application requirement, and N denotes a total number of the scaled pulses.

8. The method for digitalizing a scintillation pulse according to claim 6, wherein the non-linear scaling of the average pulse comprises:

determining a non-linear energy response curve y=f(x) of the detector;
calculating a maximum times needed for amplifying a pulse signal as:

$$A = \frac{E_u}{E_s};$$

and
determining a scaled pulse set $P^a$ corresponding to the detector as $$P_a = \left\{ P_m \cdot f\left(\frac{A}{N}\right), P_m \cdot f\left(\frac{2A}{N}\right), P_m \cdot f\left(\frac{3A}{N}\right), \ldots, P_m \cdot f(A) \right\},$$

wherein
$E_s$ denotes ray energy corresponding to the average pulse $P_m$ obtained in step S1, $E_u$ denotes an upper limit of energy of to-be-detected ray determined by a user according to an actual application requirement, and N denotes a total number of the scaled pulses.

9. The method for digitalizing a scintillation pulse according to claim 3, wherein if the step S1 of acquiring a pulse database outputted by a detector irradiated by rays of different energy is performed by means of direct collection, the step S1 comprises:
irradiating, by a plurality of ray sources with different energy, the detector according to a user requirement, and
collecting directly, by an ADC, outputted pulses to obtain a pulse set with energy distributed within a certain range.

10. The method for digitalizing a scintillation pulse according to claim 3, wherein if the step S1 of acquiring a pulse database outputted by a detector irradiated by rays of different energy is performed by combining simulation and direct collection, the step S1 comprises:
irradiating, by a plurality of energy-known ray sources, the detector respectively to obtain respective average pulses; and
simulating with an interpolation method to acquire the pulse database generated by the detector irradiated by rays within a certain range of energy.

11. The method for digitalizing a scintillation pulse according to claim 10, wherein the generating an average pulse comprises:
making an energy spectrum for the group of pulses;
fitting a photoelectric peak in the energy spectrum by a Gaussian function;
selecting all pulses whose energy values are within a scope of full width at half maximum of the fitted Gaussian function; and
obtaining the average pulse $P_m$ as a set of $$\left[ \frac{\left(\sum_{i=1}^{m} S_{(1,i)}\right)}{m}, \frac{\left(\sum_{i=1}^{m} S_{(2,i)}\right)}{m}, \ldots, \frac{\left(\sum_{i=1}^{m} S_{(h,i)}\right)}{m} \right],$$

where m denotes the number of all the selected pulses, $S_{(k,i)}$ denotes the k-th ADC sampling point of the i-th pulse, i is an integer and $0 < i \le m$, k is an integer and $0 < k \le h$, and h denotes the number of ADC sampling points.

12. The method for digitalizing a scintillation pulse according to claim 1, wherein the step S2 of acquiring complete energy information comprised in the pulse comprises:
    directly digitalizing the pulse to acquire the complete energy information comprised in the pulse; or
    sampling a physical quantity which represents the pulse energy information to indirectly acquire the complete energy information comprised in the pulse.

13. The method for digitalizing a scintillation pulse according to claim 12, wherein if the step of acquiring complete energy information comprised in the pulse is performed by directly digitalizing the pulse, the step comprises:
    critical/over-sampling the pulse by an analog-to-digital scheme or a multi-voltage threshold scheme; and
    acquiring the pulse energy information by a numerical integration method, or acquiring a maximum voltage amplitude of sampling points to represent the energy information.

14. The method for digitalizing a scintillation pulse according to claim 12, wherein if the step of acquiring complete energy information comprised in the pulse is performed by directly digitalizing a pulse, the step comprises:
    holding a peak value by a peak-holding circuit, and
    sampling a voltage amplitude of a sampling peak point to represent the pulse energy information.

15. The method for digitalizing a scintillation pulse according to claim 12, wherein if the step of acquiring complete energy information comprised in the pulse is performed by means of indirect sampling, the step comprises:
    converting a pulse amplitude to a time width by a Wilkinson converting method.

16. The method for digitalizing a scintillation pulse according to claim 1, wherein the digitalization method of undersampling and quantizing each of the pulses in the step S3 is performed by using an analog-to-digital converter or using a comparator in cooperation with a time-to-digital converter.

17. The method for digitalizing a scintillation pulse according to claim 1, wherein the estimating or fitting energy information in the step S3 is performed by a MVT method, the step of calculating pulse energy by the MVT method comprises:
    setting a plurality of voltage thresholds;
    inputting a pulse and the voltage thresholds to a comparator;
    measuring a time when a turnover logic pulse is outputted by the comparator, wherein the measured time and a corresponding voltage threshold compose an MVT sampling point;
    fitting and rebuilding a pulse by using the MVT sampling point and a pulse model; and
    performing definite integration on the rebuilt pulse or performing numerical integration on the rebuilt pulse after re-sampling to obtain the pulse energy information.

18. The method for digitalizing a scintillation pulse according to claim 1, wherein the estimating or fitting energy information in the step S3 is performed by an ADC fitting method, the step of calculating pulse energy by the ADC fitting method comprises:
    sampling a pulse signal by an ADC to obtain ADC sampling points;
    fitting and rebuilding a pulse by utilizing the ADC sampling points and a pulse model; and
    performing definite integration on the rebuilt pulse or performing numerical integration on the rebuilt pulse after re-sampling to obtain the pulse energy information.

19. The method for digitalizing a scintillation pulse according to claim 1, wherein the estimating or fitting energy information in the step S3 is performed by an empirical Bayesian estimation method, the step of calculating pulse energy by the empirical Bayesian estimation method comprises:
    acquiring digitalized pulse sampling points; and
    solving a maximum-likelihood solution of given digital samples as the estimated pulse energy information by utilizing the Bayesian theory and independence assumption.

20. The method for digitalizing a scintillation pulse according to claim 1, wherein the estimating or fitting energy information in the step S3 is performed by a TOT method, the step of calculating pulse energy by the TOT method comprises:
    estimating an expected energy value of a pulse as the pulse energy information by fitting a relationship between TOT and pulse energy.

21. The method for digitalizing a scintillation pulse according to claim 1, wherein the energy mapping relationship in the step S5 is a coefficient look-up table or an energy mapping function.

22. The method for digitalizing a scintillation pulse according to claim 21, wherein if the energy mapping relationship in the step S5 is a coefficient look-up table, a method for calculating a correction coefficient C comprises:
    calculating the correction coefficient as $$C_i = \frac{E_{(standard,i)}}{E_{(statistical,i)}},$$

where for each of the pulses in the pulse database $P_a$, $E_{(standard,i)}$ denotes energy obtained by a complete energy information acquisition method, and $E_{(statistical,i)}$ denotes energy obtained by a prior information-based undersampling pulse energy acquisition method, i is an integer and $0 < i \le N$.

23. The method for digitalizing a scintillation pulse according to claim 22, wherein the corrected energy $E_{CStatistical}$ in the step S5 is calculated by a formula: $E_{CStatistical} = C * E_{statistical}$.

24. The method for digitalizing a scintillation pulse according to claim 21, wherein if the energy mapping relationship in the step S4 is a mapping function y=g(x), derivation of the function comprises:
    acquiring a plurality of coefficient mapping points of the complete energy information acquisition method and the prior information-based undersampling pulse energy acquisition method as $$C_i = \frac{E_{(standard,i)}}{E_{(statistical,i)}},$$

where for each of the pulses in the pulse database $P_a$, $E_{(standard,i)}$ denotes energy obtained by the complete energy information acquisition method, and $E_{(statistical,i)}$ denotes energy obtained by the prior information-based undersampling pulse energy acquisition method, i is an integer and $0<i\leq N$; and obtaining the mapping function $y=g(x)$ by means of curve fitting using the coefficient mapping points.

25. The method for digitalizing a scintillation pulse according to claim 24, wherein the corrected energy $E_{CStatistical}$ in the step S5 is calculated by a formula: $E_{CStatistical}=g(E_{statistical})$.

* * * * *